(12) United States Patent
Deak

(10) Patent No.: US 7,072,209 B2
(45) Date of Patent: Jul. 4, 2006

(54) MAGNETIC MEMORY HAVING SYNTHETIC ANTIFERROMAGNETIC PINNED LAYER

(75) Inventor: James G. Deak, Eden Prairie, MN (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 10/745,531

(22) Filed: Dec. 29, 2003

(65) Prior Publication Data

US 2005/0146912 A1    Jul. 7, 2005

(51) Int. Cl.
G11C 11/15    (2006.01)
(52) U.S. Cl. .................. 365/173; 365/171; 365/87; 365/97; 427/548; 427/599
(58) Field of Classification Search ............. 365/173, 365/171, 87, 97; 427/548, 599
See application file for complete search history.

(56) References Cited

U.S. PATENT DOCUMENTS

| | | | |
|---|---|---|---|
| 4,780,848 A | 10/1988 | Daughton et al. |
| 5,587,943 A | 12/1996 | Torok et al. |
| 5,640,343 A | 6/1997 | Gallagher et al. |
| 5,659,499 A | 8/1997 | Chen et al. |
| 5,748,524 A | 5/1998 | Chen et al. |
| 5,793,697 A | 8/1998 | Scheuerlein |
| 5,861,328 A | 1/1999 | Tehrani |
| 5,956,267 A | 9/1999 | Hurst et al. |
| 5,966,323 A | 10/1999 | Chen et al. |
| 5,986,858 A | 11/1999 | Sato et al. |
| 6,005,800 A | 12/1999 | Koch et al. |
| 6,034,887 A | 3/2000 | Gupta et al. |
| 6,081,446 A | 6/2000 | Brug et al. |
| 6,097,625 A | 8/2000 | Scheuerlein et al. |
| 6,097,626 A | 8/2000 | Brug et al. |
| 6,104,633 A | 8/2000 | Abraham et al. |
| 6,134,139 A | 10/2000 | Bhattacharyya et al. |
| 6,166,948 A | 12/2000 | Parkin et al. |
| 6,172,904 B1 | 1/2001 | Anthony et al. |
| 6,174,737 B1 | 1/2001 | Durlam et al. |
| 6,191,972 B1 | 2/2001 | Miura et al. |
| 6,191,973 B1 | 2/2001 | Moyer |
| 6,211,090 B1 | 4/2001 | Durlam et al. |
| 6,211,559 B1 | 4/2001 | Zhu et al. |
| 6,219,212 B1 | 4/2001 | Gill et al. |
| 6,219,275 B1 | 4/2001 | Nishimura |
| 6,222,707 B1 | 4/2001 | Huai et al. |
| 6,226,160 B1 | 5/2001 | Gallagher et al. |
| 6,233,172 B1 | 5/2001 | Chen et al. |

(Continued)

OTHER PUBLICATIONS

"Enhanced exchange biasing in ion-beam sputtered bottom spin-valve films," M. Mao et al., IEEE Transactions on Magnetics. vol. 35, No. 5, Sep. 1999, pp. 3913-3915.

(Continued)

Primary Examiner—Viet Q. Nguyen
(74) Attorney, Agent, or Firm—Dickstein Shapiro Morin & Oshinsky LLP (57) ABSTRACT

A magnetic memory element includes a sense structure, a tunnel barrier adjacent the sense structure, and a synthetic antiferromagnet (SAF) adjacent the tunnel barrier on a side opposite the sense structure. The SAF includes an antiferromagnetic structure adjacent a ferromagnetic seed layer. The ferromagnetic seed layer provides a texture so that the antiferromagnetic structure deposited on the ferromagnetic seed layer has reduced pinning field dispersion.

29 Claims, 3 Drawing Sheets

U.S. PATENT DOCUMENTS

| | | |
|---|---|---|
| 6,242,770 B1 | 6/2001 | Bronner et al. |
| 6,256,223 B1 | 7/2001 | Sun et al. |
| 6,256,247 B1 | 7/2001 | Perner |
| 6,259,586 B1 | 7/2001 | Gill |
| 6,269,018 B1 | 7/2001 | Monsma et al. |
| 6,430,084 B1 | 8/2002 | Rizzo et al. |
| 6,430,085 B1 | 8/2002 | Rizzo |
| 6,483,734 B1 * | 11/2002 | Sharma et al. ............... 365/97 |
| 6,510,080 B1 | 1/2003 | Farrar |
| 6,525,957 B1 | 2/2003 | Goronkin et al. |
| 6,728,132 B1 * | 4/2004 | Deak ........................ 365/173 |
| 2001/0025978 A1 | 10/2001 | Nakao |
| 2001/0036675 A1 | 11/2001 | Anthony |
| 2001/0036699 A1 | 11/2001 | Slaughter |
| 2003/0021908 A1 * | 1/2003 | Nickel et al. ............... 427/551 |
| 2004/0032318 A1 * | 2/2004 | Mori et al. ............... 338/32 R |

OTHER PUBLICATIONS

"Bias-dependence of magnetic tunnel junctions," M.S. Rzchowski et al., Physics Department, University of Wisconsin-Madison, Madison, WI 53706 (3 pages).

"Spintronics: A spin-Based Electronics Vision for the Future," S.A. Wolf et al., Science, Nov. 16, 2001, vol. 294, pp. 1488-1495.

* cited by examiner

MAGNETIC MEMORY HAVING SYNTHETIC ANTIFERROMAGNETIC PINNED LAYER

BACKGROUND OF THE INVENTION

1. Field of the Invention

The present invention relates to magnetic memory elements, and more specifically to magnetic tunnel junctions having improved synthetic anti-ferromagnetic structures.

2. Brief Description of the Related Art

Various types of memory are used in digital systems such as microprocessor-based systems, digital processing systems, and the like. Recently, magnetic random access memory (MRAM) devices have been developed for use as non-volatile random access memory.

MRAM devices are based on magnetic memory elements. An MRAM device frequently includes several magnetic memory elements arranged in an array of rows and columns, with circuitry for accessing information stored in individual elements in the array.

Information is stored in each magnetic memory element as a resistance state of the element. The elements typically are layered structures, and an electrical resistance state of each element changes based on the relative orientations of magnetic moments in ferromagnetic layers within the element. The orientation of the magnetic moment in one layered structure, referred to as a "pinned" structure, is fixed as a reference, while the magnetic moment orientation of another layered structure, referred to as a "free" or "sense" structure, can be changed. The magnetic moment orientation of the free structure can be changed using an externally-applied magnetic field or current, for example. Changing the relative magnetic orientation of the two layered structures results in a change in the resistive state of the magnetic memory element. The different resistive states are recognized by electronic circuitry as bit-wise storage of data.

Typically, the free and pinned ferromagnetic structures in a magnetic memory element are separated by a non-magnetic spacer. In one type of magnetic element, known as a magnetic tunnel junction (MTJ), the spacer is referred to as a tunnel junction barrier. When the magnetic moments of the free structure and the pinned structure are aligned in the same direction, the orientation commonly is referred to as "parallel." When the two structures have opposite magnetic alignment, the orientation is termed "antiparallel."

The tunnel junction barrier is sufficiently thin that, in the presence of adequate current, quantum-mechanical tunneling of charge carriers occurs across the barrier junction between the free and pinned ferromagnetic structures. The tunneling magnetoresistance of the device typically has minimum and maximum values corresponding respectively to parallel and antiparallel magnetization moment orientations of the free and pinned structures.

In response to parallel and antiparallel magnetic states, MTJ elements present a resistance, known as the "tunneling magnetoresistance" (TMR), to a current provided across the element. In magnetic memory elements, the current typically is provided in a direction perpendicular to the surfaces of the element layers.

Current miniaturization trends in electronic componentry require that magnetic memory elements be manufactured with layers that are very thin, some layers being in the range of only tens of angstroms in thickness. At these small dimensions, minute variations in surface morphology, roughness, and constituent grain size can impact the magnetic characteristics of each layer.

Improvements in the arrangement and composition of the various layers in the magnetic memory element are desired to reduce pinning field dispersion and improve operations of magnetic memory elements based on MTJs.

BRIEF SUMMARY OF THE INVENTION

The present invention provides a magnetic memory element having reduced pinning field dispersion. The magnetic memory element includes a sense structure, a tunnel barrier adjacent the sense structure, and a pinned structure adjacent the tunnel barrier on a side opposite the sense structure. The pinned structure includes an antiferromagnetic structure adjacent a ferromagnetic structure. The ferromagnetic structure provides an upper surface on which the antiferromagnetic structure is developed. Thus, a ferromagnetic layer is provided to have minimized texture variations. The ferromagnetic layer deposits without clustering, for example, whereby a desired texture on which to develop the antiferromagnetic layer is provided. In an exemplary embodiment, nickel iron (NiFe) is used for the ferromagnetic layer. NiFe tends to grow in a 111 oriented face-centered cubic (FCC) phase, and better seeds the antiferromagnetic layer (IrMn) than cobalt iron (CoFe) which usually grows hexagonal close packed (HCP). By providing a ferromagnetic layer with minimized texture variations, the amount of magnetic dispersion is reduced in a pinning field produced by the antiferromagnetic layer. The ferromagnetic layer has a more uniform crystallographic order, acting as a seed layer to provide an antiferromagnetic layer having reduced field dispersion.

BRIEF DESCRIPTION OF THE DRAWINGS

The foregoing and other features of the invention will become more apparent from the detailed description of exemplary embodiments of the invention given below with reference to the accompanying drawings, in which.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures.

When reference is made to a substrate or wafer in the following description, previous process steps may have been utilized to form regions or junctions in or over the base semiconductor or foundation.

Figure 1:
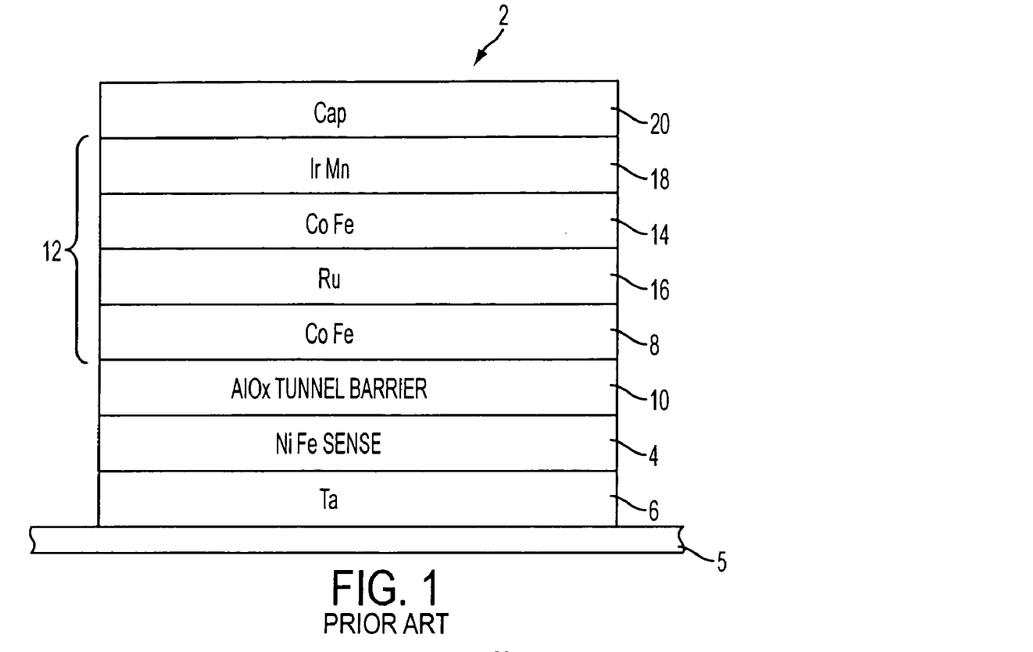
FIG. 1 illustrates a conventional MTJ MRAM memory element.

An idealized structure of a representative conventional MTJ memory element 2 is shown in FIG. 1. The memory element 2 includes a free (sense) ferromagnetic layer 4 formed of nickel-iron (NiFe) over a seed layer 6 formed of tantalum (Ta) deposited on a substrate 5. Ferromagnetic layer 4 is separated from a pinned ferromagnetic layer 8 by an alumina tunnel barrier 10. Layers in the memory element 2, such as the free and pinned ferromagnetic layers 4, 8, may be formed as a stack of several individual sub-layers. Pinned ferromagnetic layer 8 is formed of cobalt-iron (CoFe), to provide high TMR, and makes up part of a pinned structure 12, typically provided in the form of a synthetic antiferromagnet (SAF).

The magnetic orientation of pinned ferromagnetic layer 8 is maintained in a single stable magnetic polarity state by a second ferromagnetic layer 14, also made of CoFe. Ferromagnetic layer 14 is separated from the pinned layer 8 by a non-magnetic spacing layer 16, typically formed of ruthenium (Ru). Non-ferromagnetic layer, 16 produces antiferromagnetic coupling between the two ferromagnetic layers 8, 14 in the pinned structure 12. Antiferromagnetic pinning layer 18, formed of iridium manganese (IrMn) is provided above ferromagnetic layer 14. The antiferromagnetic pinning layer 18 orients the magnetic moment of ferromagnetic layer 14, and a pinning field is generated that fixes the magnetic moment of ferromagnetic layer 8. The element 2 also includes other layers, such as a capping layer 20.

The conventional memory element 2 suffers from poor performance as a result of dispersion in the pinning field. The dispersion is produced indirectly by ferromagnetic (CoFe) layer 14, due to the tendency of cobalt in the layer to texture locally. More specifically, cobalt has been found to deposit with clusters of various phases oriented randomly. This random orientation of clusters can include the hexagonal close pack (HCP) phase. The random crystallographic order of the ferromagnetic layer 14 causes the antiferromagnetic layer 18 to deposit with a random texture and magnetic order. The random morphology of the antiferromagnetic layer 18 causes the dispersion in the magnetic pinning field. NiFe is a better choice for the layer adjacent the IrMn since it grows with a 111 texture and thus better seeds the IrMn.

The random crystallographic order of the antiferromagnetic layer 18, which is grown on top of the Co rich ferromagnetic layer 14 to magnetically pin the magnetic orientation of ferromagnetic layer 8, causes dispersion in the pinning field. The dispersion of the pinning field has several detrimental effects. These include: (1) reduced TMR due to poor alignment of the pinned layer ferromagnetic layers; (2) variation in write current from bit to bit in an array due to the average local misorientation of the pinned layer; and (3) reduction in the pinning field, and possibly the disappearance of pinning in small (<200 nm) bits.

Figure 2:
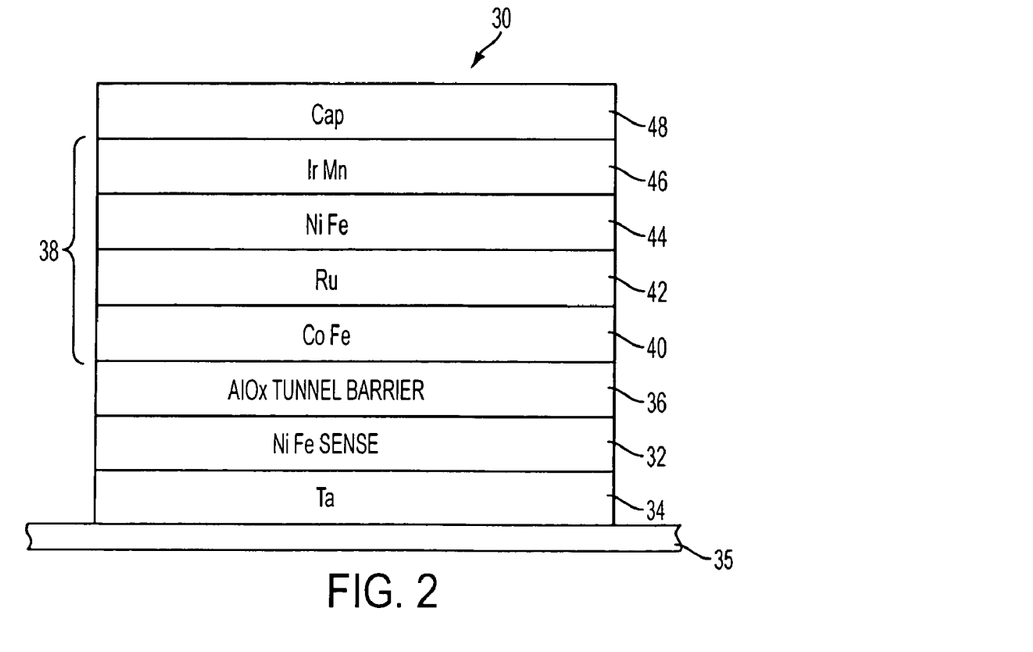
FIG. 2 illustrates an exemplary embodiment of the present invention.

Referring to FIG. 2, a layered structure 30 of a magnetic memory element is shown according to an exemplary embodiment of the present invention. A first nickel-iron (NiFe) layer 32 is provided above a tantalum seed layer 34 deposited on a substrate 35. Nickel-iron layer 32 functions as a free (sense) structure. An alumina (AlOx) layer 36 forms a tunnel barrier over ferromagnetic layer 32. A synthetic antiferromagnet (SAF) 38 has a CoFe/Ru/NiFe/IrMn layered structure and functions as a pinned structure.

The layers in the SAF 38 are as follows: Ferromagnetic cobalt-iron (CoFe) layer 40 is the bottom-most layer, which sits adjacent the tunnel barrier and produces high tunneling magnetoresistance (TMR). Cobalt in this layer is desirable for producing high TMR. Non-ferromagnetic ruthenium (Ru) layer 42 produces antiferromagnetic coupling between the two ferromagnetic layers in the SAF 38. Ferromagnetic layer 44 (NiFe) is a top-most ferromagnetic layer in the SAF 38. This layer is cobalt-free to minimizes texture variations, such as those produced in the conventional structure 2 (FIG. 1) by the CoFe layer 14. Other materials may be used in this layer, including ferromagnets broken up by a nano-oxide layer (NOL), and ferromagnets broken up by a layer used to create a desired texture on which to deposit the antiferromagnetic layer 46. The ferromagnetic layer 44 provides a surface on which the antiferromagnetic structure is developed. Thus, the ferromagnetic layer 44 also acts as a seed layer to provide a surface having minimized texture variations. According to an exemplary embodiment, the ferromagnetic layer 44 is composed and developed so as not to cluster, whereby a surface having minimized texture variations is provided on which to develop the antiferromagnetic layer. By providing a ferromagnetic layer with minimized texture variations, the antiferromagnetic layer 46 has improved crystallographic morphology, and an amount of magnetic dispersion is reduced in a pinning field produced by the subsequent antiferromagnetic layer 46.

Antiferromagnetic layer 46 (IrMn) is used to pin ferromagnetic layer 44. Antiferromagnetic layer 46 is composed of any of various antiferromagnetic materials including, but not limited to, iridium manganese (IrMn), platinum manganese (PtMn), nickel manganese (NiMn), platinum palladium manganese (PtPdMn), rhodium manganese (RhMn), or chromium platinum manganese (CrPtMn). Antiferromagnetic layer 46 exhibits less magnetic field dispersion as a result of ferromagnetic layer 44 being made up of NiFe or other material that minimizes texture variations, as compared to the conventional Co-based layer 14, for example. A cap layer 48 also is provided.

Other advantages of the present invention relate to differences in saturation magnetization (Msat) between cobalt-based ferromagnetic materials, (e.g. CoFe) as compared to Ni-based materials such as NiFe. The difference in Msat allows the CoFe material of layer 40 to be thinned, which can be useful in controlling Néel coupling between the sense layer 32 and the pinned layer. 40. In addition, the thickness of the NiFe sense layer 32 can be more easily controlled for setting the offset field to the SAF pinned layer stack 38.

Various techniques known in the art can be used to form devices according to the present invention. Layers of the device can be deposited sequentially, for example, by sputtering, evaporation, metalorganic chemical vapor deposition (MOCVD), and electroplating. Although the exemplary memory element is shown with a free layer on the bottom and other layers formed above (top-pinned), it will be clear to those of skill in the art that the memory element could have the opposite configuration, with a free layer on top. Other constructions or orientations of the elements are contemplated as being encompassed by the present invention, including formation of the memory element within a trench, for example. Etching of materials can take place by ion etch, reactive ion etch, wet chemistry, and electrochemistry, for example. All of the examples above are non-limiting.

Figure 3:
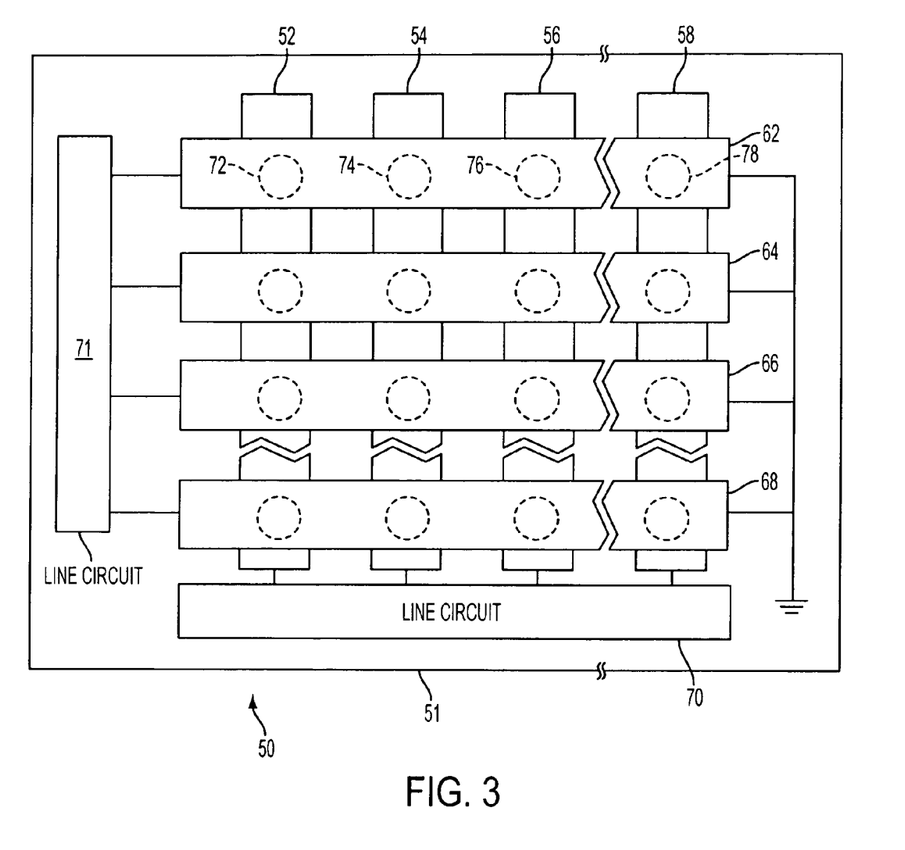
FIG. 3 illustrates a magnetic random access memory according to an exemplary embodiment of the present invention.

Referring to FIG. 3, an MRAM array 50 according to an exemplary embodiment of the present invention is illustrated. Array 50 is formed over a substrate 51 and includes column lines 52, 54, 56, 58, and row lines 62, 64, 66, 68. Columns and rows are selected by column and row line circuits 70 and 71, respectively. At the intersection of each column and row line is an MTJ memory element fabricated in accordance with the invention and designated as 72, 74, 76, and 78.

Figure 4:
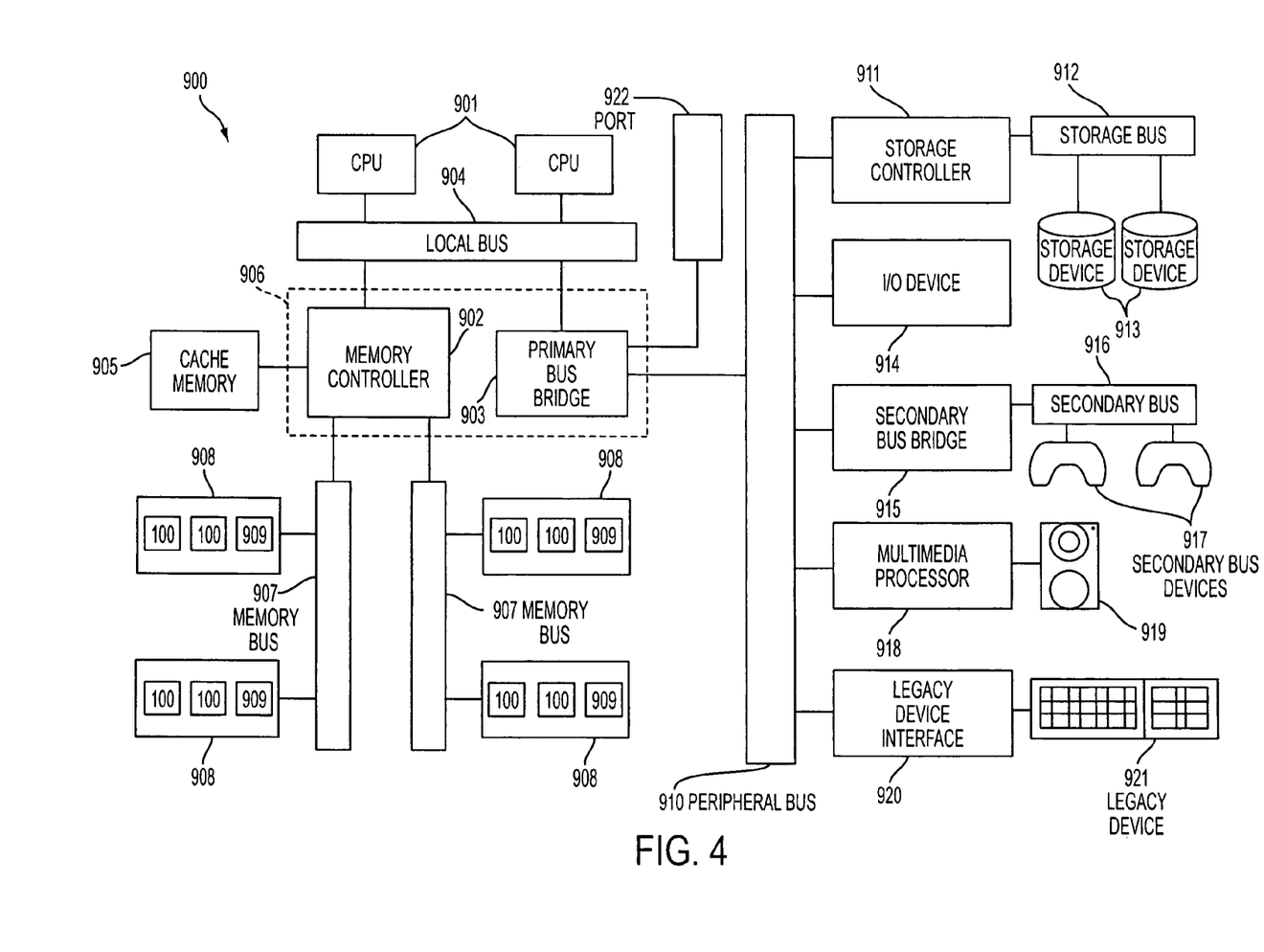
FIG. 4 illustrates a microprocessor-based system that utilizes magnetic memory as in 3.

FIG. 4 illustrates an exemplary processing system 900 which may utilize a memory device 100 including a memory array 50 of the present invention. The processing system 900 includes one or more processors 901 coupled to a local bus 904. A memory controller 902 and a primary bus bridge 903 are also coupled to the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be a universal serial bus (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple at least one legacy device 921, for example, older styled keyboards and mice, to the processing system 900.

The processing system 900 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While various embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A magnetic memory element comprising:
    a sense structure;
    a tunnel barrier adjacent the sense structure; and
    a pinned structure adjacent the tunnel barrier on a side opposite the sense structure, the pinned structure including an antiferromagnetic structure adjacent a cobalt-free ferromagnetic seed layer, the cobalt-free ferromagnetic seed layer having minimized texture variations as compared to a ferromagnetic layer containing cobalt.

2. A magnetic memory element as in claim 1, wherein the cobalt-free ferromagnetic seed layer functions to impart a desired texture on the antiferromagnetic structure deposited on the cobalt-free ferromagnetic seed layer.

3. A magnetic memory element as in claim 1, wherein the pinned structure includes a cobalt-containing ferromagnetic layer above the tunnel barrier.

4. A magnetic memory element as in claim 1, wherein the cobalt-free ferromagnetic seed layer comprises nickel iron.

5. A magnetic memory element as in claim 1, wherein the cobalt-free ferromagnetic seed layer is broken up by a texturing component.

6. A magnetic memory element as in claim 1, wherein the cobalt-free ferromagnetic seed layer includes a nano-oxide layer.

7. A magnetic memory element as in claim 1, wherein the antiferromagnetic structure includes at least one of iridium manganese, platinum manganese, nickel manganese, platinum palladium manganese, rhodium manganese, and chromium platinum manganese.

8. A magnetic memory element as in claim 1, wherein the pinned structure includes a ruthenium layer adjacent the cobalt-free ferromagnetic seed layer on a side opposite the antiferromagnetic structure, the cobalt containing ferromagnetic layer being provided between the ruthenium layer and the tunnel barrier.

9. A method of producing a magnetic memory element, the method comprising:
forming a sense structure;
providing a tunnel barrier adjacent the sense structure; and
providing a pinned structure adjacent the tunnel barrier on a side opposite the sense structure, the pinned structure including an antiferromagnetic structure provided adjacent a ferromagnetic layer, the ferromagnetic layer functioning to impart minimal textural variations on the antiferromagnetic structure.

10. A method according to claim 9, wherein providing the pinned structure includes providing a cobalt iron layer adjacent the tunnel barrier, providing a ruthenium layer adjacent the cobalt iron layer, providing a cobalt-free ferromagnetic layer adjacent the ruthenium layer, and providing an antiferromagnetic layer adjacent the cobalt-free ferromagnetic iron layer.

11. A method of producing a magnetic memory element comprising:
forming a pinning structure having a cobalt-free ferromagnetic layer with a texture having minimal variations; and
forming an antiferromagnetic layer on the cobalt-free ferromagnetic layer.

12. A magnetic tunnel junction device having memory elements comprising:
a sense structure;
a tunnel barrier adjacent the sense structure; and
a pinned structure adjacent the tunnel barrier on a side opposite the sense structure, the pinned structure including an antiferromagnetic structure adjacent a ferromagnetic structure, the ferromagnetic structure being free of cobalt and providing a texture having minimal variations, the ferromagnetic layer functioning to reduce dispersion of a pinning field of the antiferromagnetic structure as compared to an antiferromagnetic structure provided on a cobalt-containing ferromagnetic layer.

13. A magnetic tunnel junction device as in claim 12, wherein the ferromagnetic layer is broken up by a texturing component.

14. A magnetic tunnel junction device element as in claim 12, wherein the ferromagnetic structure includes a nano-oxide layer.

15. A magnetic tunnel junction device as in claim 12, wherein the ferromagnetic structure includes a nickel iron layer.

16. A magnetic tunnel junction device as in claim 12, wherein the ferromagnetic structure includes amorphous ferromagnets.

17. A magnetic tunnel junction device as in claim 12, wherein the antiferromagnetic structure includes at least one of iridium manganese, platinum manganese, nickel manganese, platinum palladium manganese, rhodium manganese, and chromium platinum manganese.

18. A magnetic tunnel junction device as in claim 12, wherein the pinned structure includes a ruthenium layer adjacent the ferromagnetic structure on a side opposite the antiferromagnetic structure, and a cobalt iron layer between the ruthenium layer and the tunnel barrier.

19. A magnetic memory including an array of memory elements, each memory element comprising a magnetic memory element including:

a sense structure;
a tunnel barrier adjacent the sense structure; and
a pinned structure adjacent the tunnel barrier on a side opposite the sense structure, the pinned structure including an antiferromagnetic structure adjacent a non-cobalt containing ferromagnetic structure, the ferromagnetic structure being cobalt-free and providing a texture to the antiferromagnetic structure that reduces dispersion of a magnetic pining field as compared to an antiferromagnetic structure provided on a cobalt-containing ferromagnetic structure.

20. A magnetic memory as in claim 19, wherein the ferromagnetic layer is broken up by a texturing component.

21. A magnetic memory as in claim 19, wherein the ferromagnetic structure includes a nano-oxide layer.

22. A magnetic memory as in claim 19, wherein the ferromagnetic structure includes a nickel iron layer.

23. A magnetic memory as in claim 19, wherein the antiferromagnetic structure includes at least one of iridium manganese, platinum manganese, nickel manganese, platinum palladium manganese, rhodium manganese, and chromium platinum manganese.

24. A magnetic memory as in claim 19, wherein the pinning structure includes a ruthenium layer adjacent the ferromagnetic structure on a side opposite the antiferromagnetic structure, and a cobalt iron layer between the ruthenium layer and the tunnel barrier.

25. A processor system comprising:
a processor; and
a magnetic random access memory device for exchanging data with the processor, the memory device comprising an array of memory elements, each memory element comprising a magnetic memory element including:
a sense structure;
a tunnel barrier adjacent the sense structure; and
a pinned structure adjacent the tunnel barrier on a side opposite the sense structure, the pinned structure including an antiferromagnetic structure adjacent a ferromagnetic structure, the ferromagnetic structure being cobalt-free and providing a surface having minimal texture variation to the antiferromagnetic structure.

26. A method of forming a magnetic tunnel junction element comprising:
forming a sense structure;
providing a tunnel barrier adjacent the sense structure; and
providing a pinned structure adjacent the tunnel barrier on a side opposite the sense structure, the pinned structure including an antiferromagnetic structure provided adjacent a ferromagnetic structure, the ferromagnetic structure functioning to impart minimal textural variations on the antiferromagnetic structure.

27. A method according to claim 26, wherein depositing the pinned structure includes providing a cobalt iron layer adjacent the tunnel barrier, providing a ruthenium layer adjacent the cobalt iron layer, providing a nickel iron layer adjacent the ruthenium layer, and providing the antiferromagnetic layer adjacent the nickel iron layer.

28. A magnetic memory element comprising:
a first layered structure with a magnetic moment orientation that can be changed;
a second layered structure with a fixed magnetic moment orientation; and
a barrier structure between the first and second layered structures, the second layered structure including:

a cobalt-containing ferromagnetic layer that meets the barrier structure at a first interface at which tunneling magnetoresistance occurs;

an antiferromagnetic layer; and a cobalt-free ferromagnetic layer between the cobalt-containing ferromagnetic layer and the antiferromagnetic layer, the cobalt-free ferromagnetic layer meeting the antiferromagnetic layer at a second interface having uniform crystallographic order.

29. A method of producing a magnetic memory element, the method comprising:

forming a first layered structure with a magnetic moment orientation that can be changed;

forming a barrier structure over the first layered structure;

forming a cobalt-containing ferromagnetic layer on the barrier structure, the cobalt-containing ferromagnetic layer meeting the barrier structure at a first interface at which tunneling magnetoresistance occurs;

forming a cobalt-free ferromagnetic layer over the cobalt-containing ferromagnetic layer; and forming an antiferromagnetic layer on the cobalt-free ferromagnetic layer, the antiferromagnetic layer meeting the cobalt-free ferromagnetic layer at a second interface having uniform crystallographic order; the cobalt-containing and cobalt-free ferromagnetic layers having a fixed magnetic moment orientation.

* * * * *

UNITED STATES PATENT AND TRADEMARK OFFICE
CERTIFICATE OF CORRECTION

PATENT NO.        : 7,072,209 B2
APPLICATION NO. : 10/745531
DATED             : July 4, 2006
INVENTOR(S)       : James G. Deak It is certified that error appears in the above-identified patent and that said Letters Patent is hereby corrected as shown below:

Column 4, line 9, "minimizes" should read --minimize--;

Column 5, line 33, "include" should read --includes--;

Column 5, line 47, "also coupled" should read --also be coupled--;

Column 5, line 63, "via to the" should read --via the--;

Column 5, line 66, "to one additional" should read --to additional--; and

Column 6, line 17, "system" should read --systems--.

In Claim 19, the following error is corrected:

Column 8, line 9, "pining" should read --pinning--.

Signed and Sealed this

Fourteenth Day of November, 2006

JON W. DUDAS
*Director of the United States Patent and Trademark Office*